United States Patent
Na et al.

(10) Patent No.: US 8,461,624 B2
(45) Date of Patent: Jun. 11, 2013

(54) MONOLITHIC THREE TERMINAL PHOTODETECTOR

(75) Inventors: Yun-chung N Na, Palo Alto, CA (US); Yimin Kang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 12/952,023

(22) Filed: Nov. 22, 2010

(65) Prior Publication Data

US 2012/0126286 A1    May 24, 2012

(51) Int. Cl.
*H01L 31/072* (2012.01)
*H01L 31/109* (2006.01)
*H01L 31/0328* (2006.01)
*H01L 31/0336* (2006.01)

(52) U.S. Cl.
USPC ........................................... 257/186; 257/371

(58) Field of Classification Search
USPC .................................. 257/186, 371, E31.064
See application file for complete search history.

(56) References Cited

U.S. PATENT DOCUMENTS

| | | | | |
|---|---|---|---|---|
| 5,838,708 A | * | 11/1998 | Lin et al. ..................... | 372/50.21 |
| 2006/0251375 A1 | * | 11/2006 | Morse ........................... | 385/141 |
| 2007/0200141 A1 | | 8/2007 | Ishibashi et al. | |
| 2011/0260733 A1 | * | 10/2011 | Funcell ......................... | 324/501 |

FOREIGN PATENT DOCUMENTS

JP    2001320077    11/2001

OTHER PUBLICATIONS

International Search Report and Written Opinion for Application No. PCT/US2011/060807 dated May 9, 2012, 8 pages.
Daoxin Dai et al., "Derivation of the Small Signal Response," IEEE 2009, Issue 5, pp. 1328-1336, Oct. 31, 2010.

* cited by examiner

*Primary Examiner* — Phuc Dang
(74) *Attorney, Agent, or Firm* — Blakely, Sokoloff, Taylor & Zafman LLP (57) ABSTRACT

Photodetectors operable to achieve multiplication of photogenerated carriers at ultralow voltages. Embodiments include a first p-i-n semiconductor junction combined with a second p-i-n semiconductor junction to form a monolithic photodetector having at least three terminals. The two p-i-n structures may share either the p-type region or the n-type region as a first terminal. Regions of the two p-i-n structures doped complementary to that of the shared terminal form second and third terminals so that the first and second p-i-n structures are operable in parallel. A multiplication region of the first p-i-n structure is to multiply charge carriers photogenerated within an absorption region of the second p-i-n structure with voltage drops between the shared first terminal and each of the second and third terminals being noncumulative.

19 Claims, 4 Drawing Sheets

FIG. 5A          FIG. 5B

MONOLITHIC THREE TERMINAL PHOTODETECTOR

FIELD

Embodiments of the present invention relate to the semiconductor devices and more particularly to monolithic semiconductor photodetectors.

DISCUSSION OF RELATED ART

Avalanche photodetectors (APD) are often used in applications where high sensitivity is needed, such as fiber-optic telecommunications and single-photon detection applications. A conventional monolithic APD typically has a layered semiconductor diode structure including an intrinsic (i) layer disposed between a heavily doped p-type (p+) and n-type (n+) regions. With this vertically layered P-i-N diode stack under reverse bias, charge carriers photogenerated within the intrinsic region induce carrier multiplication as they are swept to heavily doped layers.

Figure 1:
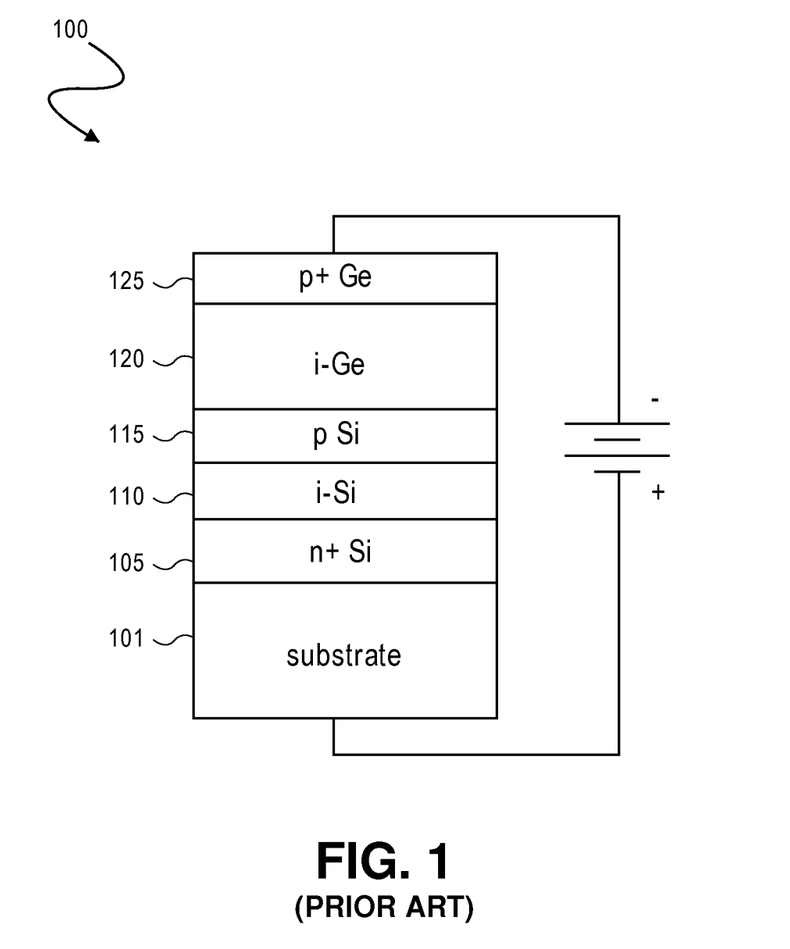
FIG. 1 is a cross-sectional view of a conventional avalanche photodetector diode structure requiring high bias voltages for operation.

Germanium (Ge) APD structures are attractive for near-infrared applications as Ge has high responsivity within this spectrum. A conventional Ge-based APD diode 100 is depicted in FIG. 1. APD diode 100 utilizes a stacked diode structure disposed on a substrate 101. The layered diode stack includes an i-Ge light absorption layer 120 disposed between a p+ Ge top layer 125, and a p-Si layer 115. Disposed below the p-Si layer 115 is an n+ Si layer 105 with an i-Si carrier multiplication layer 110 disposed there between. Like many other conventional monolithic APD diodes, operation of the APD diode 100 requires a high bias voltage (e.g., usually around 20V) across the p+ Ge top layer 125 and the n+ Si layer 105. Such high operating voltages however, render conventional monolithic APD diodes like the APD diode 100 incompatible with many electronics platforms (e.g., servers, mobile devices, etc.) which operate at much lower voltages.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific fabrication techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Three terminal photodetector architectures are described herein. In certain embodiments, such photodetectors are operable to achieve multiplication of photogenerated carriers at ultralow voltages. In embodiments, avalanche multiplication of photogenerated carriers is achieved by the photodetector at bias voltages below 10V. For the exemplary implementations described herein, avalanche multiplication of photogenerated carriers is achieved at bias voltages below 6V, and more particularly between 4.5 and 5.5V. It will be appreciated by those in skilled the art that carrier multiplication at low voltages is but one advantage of the photodetector architecture described herein, and the architecture may be adapted to other modes of operation (e.g., non-avalanche) without departing substantially from the technical aspects described in the following embodiments.

The exemplary embodiments generally include a first p-i-n semiconductor junction monolithically integrated with a second p-i-n semiconductor junction to form a monolithic photodetector having at least three terminals. The two p-i-n structures may share either the p-type region or the n-type region as a first terminal. Regions of the two p-i-n structures doped complementary to that of the shared terminal form second and third terminals so that the first and second p-i-n structures are operable in parallel rather than in series. A multiplication region of the first p-i-n structure may be biased to multiply charge carriers photogenerated within an absorption region of the second p-i-n structure. As such, the multiplication region is proximate to, but separated from, the absorption region with voltage drops between the shared first terminal and each of the second and third terminals being noncumulative and optionally wholly independent. During operation, a first reverse bias may be applied across the first and third terminals to sweep carriers photogenerated in the second p-i-n structure toward the multiplication region in the first p-i-n structure. A multiplied photocurrent is then generated between the first and second terminals by a second reverse bias.

Embodiments of the photodetectors described herein include top-down devices with an absorption region disposed over a multiplication region, bottom-up devices with an absorption region disposed below a multiplication region, and sidewall devices with a multiplication region formed in a trench or on a sidewall of an absorption region. Although the various device orientations may have different illumination characteristics (e.g., topside/backside/lateral illumination, etc.) and fabrication challenges, a top-down device orientation is generally readily adaptable by one of ordinary skill into other configurations which maintain the relative positions of the various functional regions of the device. Therefore, although exemplary photodetector embodiments are described and illustrated herein in the context of a top-down device, any orientation, inverted or otherwise, which maintains the location of the function regions relative each other (e.g., the multiplication region relative to the absorption region) is within the scope of the present invention.

Figure 2A:
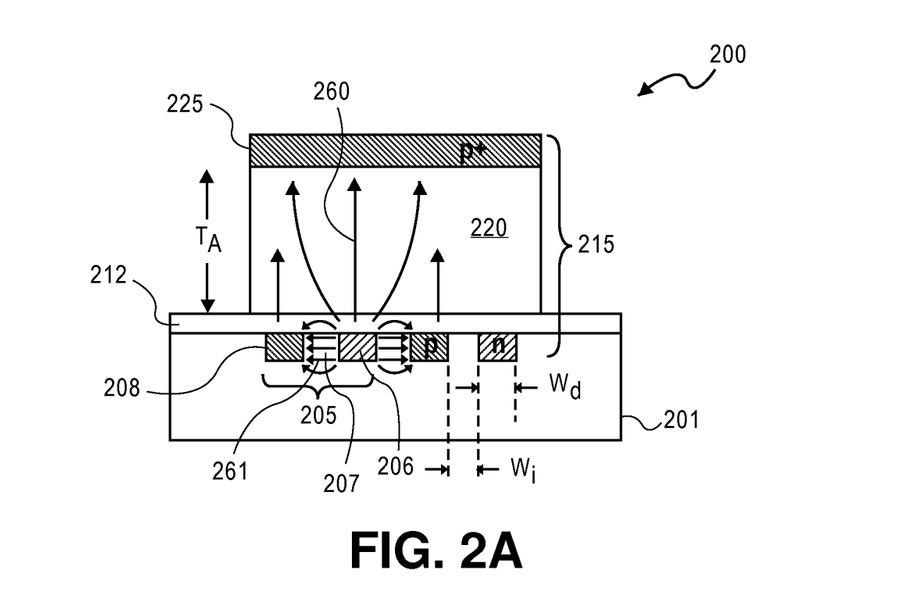
FIG. 2A is a cross-sectional view of a three terminal photodetector structure in accordance with an embodiment of the present invention.
Figure 2B:
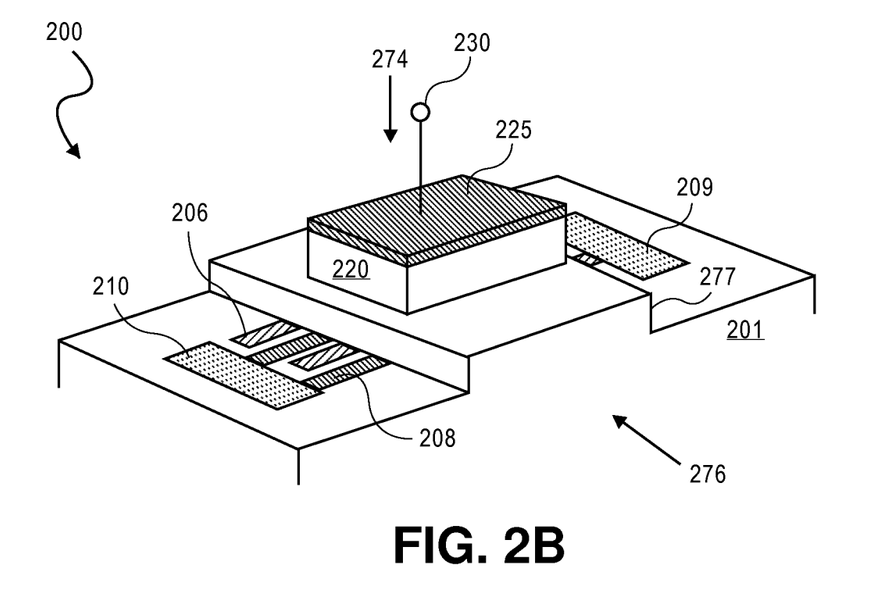
FIG. 2B is an isometric view of a three terminal photodetector structure in accordance with an embodiment of the present invention.

FIG. 2A is a cross-sectional view of a three terminal photodetector 200 in accordance with an embodiment of the present invention. FIG. 2B is an isometric view of the photodetector 200 illustrated in FIG. 2A. In this exemplary embodiment, an absorption region of the photodetector at least overlaps an area of a substrate occupied by a multiplication region of the photodetector. In alternative sidewall detector embodiments however, the two p-i-n structures may occupy separate areas of a substrate. As shown in FIG. 2A, a first p-i-n structure 205 is formed in or on a substrate 201. The substrate 201 may generally be any material suitable for semiconductor device fabrication, such as a bulk substrate composed of a single crystal of a material which may include, but is not limited to, silicon, germanium, silicon-germanium or a III-V compound semiconductor material (e.g., InP). In another embodiment, substrate 201 includes a bulk layer with a top epitaxial layer. In a specific embodiment, the bulk layer is composed of a single crystal of a material which may include, but is not limited to, silicon, germanium, silicon-germanium, a III-V compound semiconductor material, while the top epitaxial layer is composed of a single crystal layer which may include, but is not limited to, silicon, germanium, silicon-germanium or a III-V compound semiconductor material. The bulk substrate or top epitaxial layer material may be selected on the basis of whether an absorption region or a multiplication region is to be formed in the substrate semiconductor. For the exemplary embodiment depicted in FIG. 2A, the substrate 201 is silicon.

The first p-i-n structure 205 includes an n-type region 206 and a p-type region 208. As shown in FIG. 2B, a plurality of n-type regions 206 is interdigitated with a plurality of the p-type regions 208 to form an array across an area of the substrate 201. In embodiments, at least some of the plurality of the p-type regions 206 are electrically connected to a first terminal 209. Similarly, at least some of the plurality of the p-type regions 208 are electrically connected to a second terminal 210. Conventional manufacturing techniques may be used to form such interdigitated regions. For the exemplary silicon substrate, the p-type and n-type regions may be boron and phosphorous impurity doped regions formed via conventional mask and implant operations. Generally, the higher the doping concentration the better, with a reduction in parasitic resistances for higher doping concentrations. Also, the implant recipe should also take into account dopant diffusion during thermal activation which can be readily modeled with known technology. An exemplary doping concentration range is 1 e19 $cm^{-3}$-1 e20 $cm^{-3}$. Vertical (thickness) and lateral (width) dimensions of the p-type and n-type regions may also vary widely to achieve a desired resistance-capacitance product (RC) which effects bandwidth of the photodetector 200. For the exemplary silicon substrate 201, each of the doped p-type and n-type regions 206, 208 are silicon and may have a thickness of about 0.5 μm and a width of between about 0.1 μm and about 0.5 μm.

A multiplication region 207 is disposed between an n-type region 206 and p-type region 208. In an embodiment the multiplication region 207 comprises a first group IV semiconductor. In one such embodiment, the multiplication region 207 is an intrinsic region of the substrate (e.g., intrinsic silicon) between impurity doped n-type and p-type regions so that an area of the substrate 201 is covered with the first p-i-n structure 205 coupled to the first and second terminals 209, 210. In the exemplary embodiment, this first p-i-n structure is laterally oriented. Generally, the n-type region 206 is to be spaced apart from the p-type region 208 for the multiplication region 207 to have a width $W_i$ that provides sufficient field for avalanche multiplication to occur in the multiplication region 207 at the desired voltage bias between the first and second terminals 209, 210. Generally, depending on the semiconductor material from which the multiplication region 207 is formed, the desired operating voltage and desired gain, $W_i$ may be dimensioned anywhere from the smallest definable dimension (e.g., currently about 30 nm for photolithography) to 150 nm or more. For the exemplary Si embodiment where the photodetector 200 is operable as an APD with gains of 10 or more at a bias of less than 5.5 V between the first and second terminals 209, 210, the n-type and p-type regions 206, 208 may be patterned with conventional 248 nm or 193 nm lithography equipment for a $W_i$ of about 100 nm.

In embodiments, a second p-i-n structure is formed proximate to a first p-i-n structure. Referring to the exemplary embodiment illustrated in FIG. 2A and 2B, the second p-i-n structure 215 is physically positioned relative to the first p-i-n structure 205 so that an absorption region 220 is sufficiently close to the multiplication region 207 that a photogenerated carrier can be swept into the field generated between the first and second terminals 209, 210. For example, in the photodetector 200, the absorption region 220 is disposed over the multiplication region 207 but because the first and second p-i-n structures 205, 215 share the first terminal 209, a carrier generated in the absorption region 220 will travel along two nearly orthogonal transit paths. For example, a carrier generated in the absorption region 220 first drifts predominantly along the vertically oriented field lines 260 between the first and third terminals 209 and 230 until the carrier reaches the high field region between the first and second terminals 209, 210 at which point the carrier drifts predominantly along the horizontal field lines 261. In embodiments, while the carrier is drifting along the horizontal field lines 261, impact ionization occurs (i.e., avalanche multiplication) and signal is gained.

Generally, the absorption region 220 may be of any semiconductor material suitable for carrier photogeneration at one or more light wavelengths. In particular embodiments the absorption region 220 is a group IV semiconductor. In one such embodiment operable in a near-infrared spectrum (e.g., including 1310 nm and 1550 nm), the absorption region 220 is Ge. In the exemplary embodiment having a Si substrate, a Ge absorption region 220 is disposed over a Si multiplication region. In such embodiments, the Ge absorption region 220 is directly grown on the Si substrate through either crystallization of a deposited polycrystalline Ge film or by epitaxial Ge growth on the Si substrate 201 as a template using techniques known in the art. In alternative group IV embodiments, the absorption region 220 is a $Si_xGe_y$ alloy or merely Si, both of which may also be either epitaxially grown lattice matched upon the Si substrate 201 or recrystallized from deposited polycrystalline film. In alternative III-V substrate embodiments, the absorption region 220 may be a group III-V semiconductor such as an InGaAs ternary alloy or the like which is epitaxially grown upon the III-V substrate 201.

The absorption region 220 may have various levels of impurity doping. In the exemplary embodiment, the absorption region 220 has minimal impurities (i.e., no specific impurity addition during epitaxial growth) and is therefore referred to as an "intrinsic" (i-layer). However, the impurities present in the absorption region 220 may be at the level and in the form of any functional equivalent detector absorption region known in the art. In the exemplary embodiment to maintain an as-grown minimal impurity level, a diffusion barrier 212 is formed prior to growth of the absorption region 220 to impede impurity diffusion from the n-type and/or p-type regions 206, 208. In one embodiment, the diffusion barrier 212 is undoped/intrinsically doped Si having a thickness of about 100 nm, for example. Like the absorption region 220, the diffusion barrier 212 may be epitaxially grown or formed with any bulk deposition/anneal process known in the art. The thickness $T_A$ of the absorption region 220 may be varied over ranges typical in to the art with the thickness of the absorption region 220 selected based on responsivity and bandwidth figures of merit. Exemplary Ge absorption regions 220 have thicknesses between about 0.4 μm and about 3 μm.

Disposed over the absorption region 220 is a highly doped region 225 to complete the second p-i-n structure 215. The highly doped region 225 is to be coupled to the third terminal 230. Depending upon whether electron impact ionization or hole impact ionization plays a major role in the multiplication region 207, the highly doped region 225 is either a p-type or n-type, respectively. For one embodiment where the multiplication region 207 is silicon, the highly doped region 225 is p-type. To form the highly doped region 225, a top surface of the absorption semiconductor may be heavily doped. For example, in one embodiment a top surface of a Ge layer may be p+ doped to 5 e19 $cm^{-3}$-1 e20 $cm^{-3}$.

With the layers of the photodetector 200 formed, lateral (width) dimensions of the absorption region 220 may then be patterned (masked and etched) with known techniques to vary the photodetector area over a range typical in to the art. For example, the absorption region 220 may be lithographically defined to span an area selected based on the spot size needed for a given application (e.g., normal incident illumination 274 vs. edge illumination 276, etc.). Therefore, in certain photodetector embodiments, the absorption region may cover an area of the substrate between 4 $μm^2$ and 20 $μm^2$, with 10 $μm^2$ being useful for many popular near infrared communication implementations. Techniques known in the art may be further applied to metallize the terminals 209, 210 and 230, and to integrate the photodetector 200 into a monolithic photodetector circuit.

In a further embodiment, the photodetector 200 is a component of an integrated photonic device on a semiconductor chip that includes a waveguide structure 277 to couple light into the photodetector 200. In an embodiment the waveguide structure 277 is formed in the substrate or in an overlying material layer to confine optical modes in some monolithic applications employing edge illumination 276. For the illustrated embodiment, the waveguide structure 277 is a rib formed in substrate 201 (e.g., silicon) using known manufacturing techniques. Evanescent techniques may be adapted to the photodetector 200 to coupled edge illumination 276 from the waveguide structure 277 into the overlying absorption region 220. Portions of the waveguide structure 277 upstream of the photodetector 200 may include passive or active grating structures, optical de-multiplexers, or the like known in the art.

Figure 3:
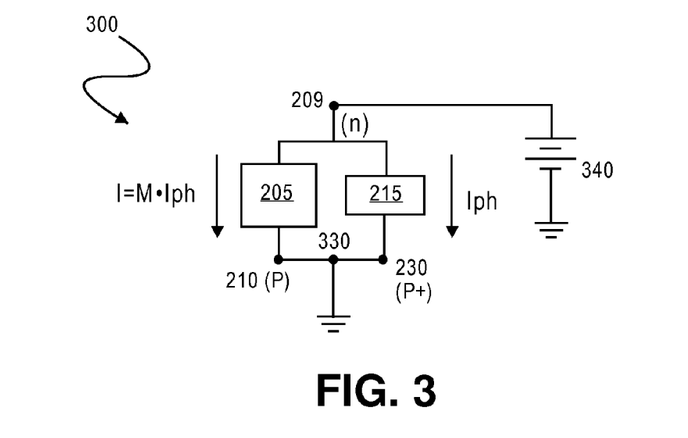
FIG. 3 is a schematic of a three terminal photodetector circuit, in accordance with an embodiment of the present invention.

FIG. 3 is a schematic of a three terminal photodetector circuit 300, in accordance with an embodiment of the present invention. The circuit 300 includes the first p-i-n structure 205 coupled to a first terminal 209 and to a second terminal 210. In the exemplary embodiment, the first p-i-n structure 205 comprises an arrayed plurality of n-type regions interdigitated with a plurality of the p-type regions with i-layers disposed there between, each of the n-type regions coupled to the first terminal 209 and each of the p-type regions coupled to the second terminal 210 (e.g., as illustrated in FIGS. 2A-2B). The second p-i-n structure 215 is coupled to the first terminal 209 and to the third terminal 230. In an embodiment, the second p-i-n structure 215 includes an absorption i-layer disposed over the arrayed n-type regions interdigitated with the p-type regions (e.g., as illustrated in FIGS. 2A-2B). A second p-type layer is coupled to the third terminal 230.

One or more voltage supplies are coupled to the terminals 209, 210 and 230 to reverse bias the first and the second p-i-n structures 205, 215 with the reverse bias across the second p-i-n structure 215 being sufficient to sweep carriers generated in the absorption region into the multiplication region and the reverse bias across the first p-i-n structure 205 being sufficient to induce multiplication of the carriers swept into the multiplication region. In certain embodiments a first voltage supply 340 may reverse bias the first p-i-n structure 205 at a first voltage potential while a second, separate voltage supply (not depicted) reverse biases the second p-i-n structure 215 at a second potential different than the first. However, in the exemplary embodiment, the second and third terminals 210, 230 are coupled to a node 330 which is to be held at a reference voltage (e.g., ground). As such, the first voltage supply 340 is connected across the first and second p-i-n structures 205, 215 in parallel.

During operation of the circuit 300, a reverse bias, for example between 5 and 5.5V, is applied to the second p-i-n structure 215 to sweep charge carrier current, photogenerated in an absorption region of the second p-i-n structure 215, toward a first p-i-n structure 205 monolithically integrated with the second p-i-n structure 315 ($I_{ph}$). With the first p-i-n structure 205 also reverse biased, for example between 5 and 5.5V, swept charge carriers are multiplied by a factor M within a multiplication layer of the first p-i-n structure 205 ($MI_{ph}$). Upon exposing the second p-i-n structure 215 to normal-incident or edge illumination, the multiplied photocurrent $MI_{ph}$ is then detected across the first p-i-n structure with a conventional sensing circuit. Thus, unlike conventional photodetector diode-based circuits, reverse bias voltage drops across the absorption region and multiplication region are not in series, but rather in parallel. This parallel configuration reduces the total operation voltage needed for avalanche multiplication of photogenerated carriers.

Figure 4:
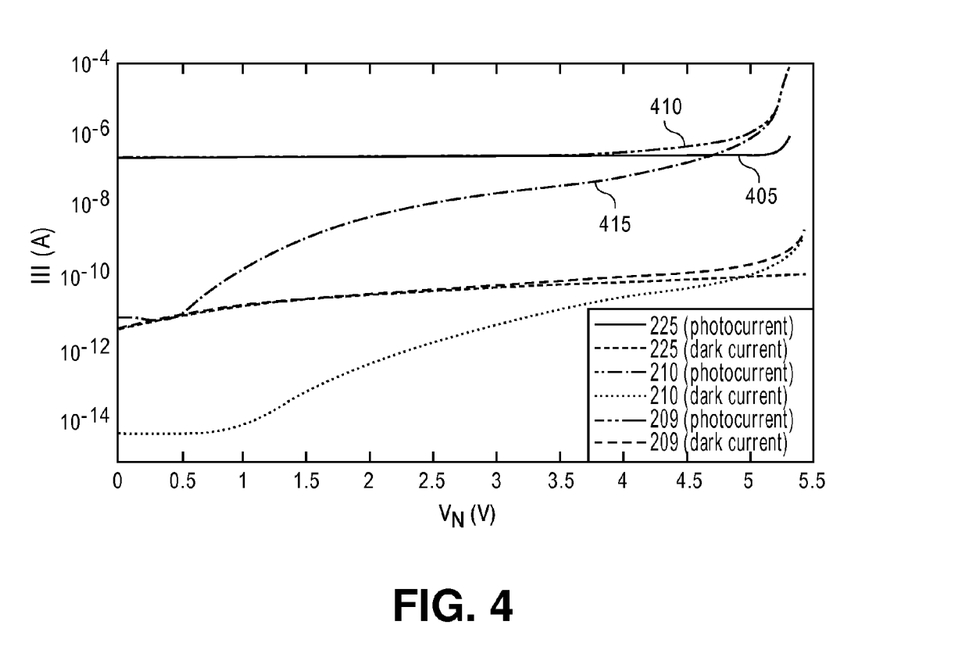
FIG. 4 illustrates current voltage (I-V) curves for a three terminal photodetector, in accordance with an embodiment of the present invention.

FIG. 4 illustrates IV curves for a three terminal photodetector, in accordance with an embodiment of the present invention. In FIG. 4, both photocurrent and dark current are plotted for each of the first, second, and third terminals of the photodetector 200 as a function of a reverse bias voltage ($V_n$) across each of the first and second p-i-n structures 205, 215

(where the second and third terminals 210 and 230 are held at a same reference potential relative to the first terminal 209). As shown the total photocurrent 410 at the first terminal 209 begins to deviate from the photocurrent 405 flowing between the first terminal 209 and the third terminal 230 as $V_n$ increases and photocurrent 415 between the first terminal 209 and the second terminal 210 increases with higher multiplication at the associated higher fields. As such, the photodetector 200 is operable in two distinct regimes. In a first regime (where $V_n$ is less than about 4V for the exemplary embodiment) the photodetector 200 operates as a standard Ge p-i-n photodiode. In a second regime (where $V_n$ is greater than about 5V for the exemplary embodiment), the current path changes and the photodetector 200 operates as an APD where the photogenerated carriers from the second p-i-n structure 215 are multiplied at locations near the first p-i-n structure 205. As further shown in FIG. 3, at $V_n$ of about 5.2V, APD gain of about 10 is obtained.

Figure 5A:
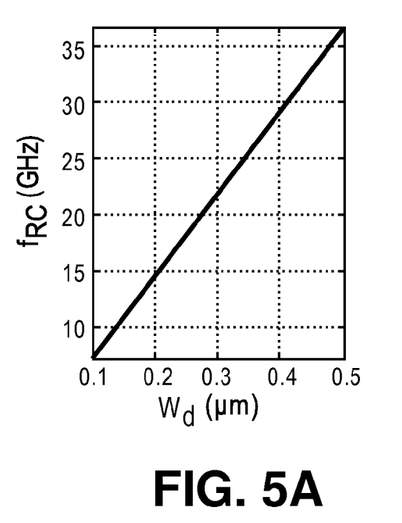
FIGS. 5A and 5B illustrate bandwidth curves as a function of three terminal photodetector device parameters, in accordance with an embodiment of the present invention.
Figure 5B:
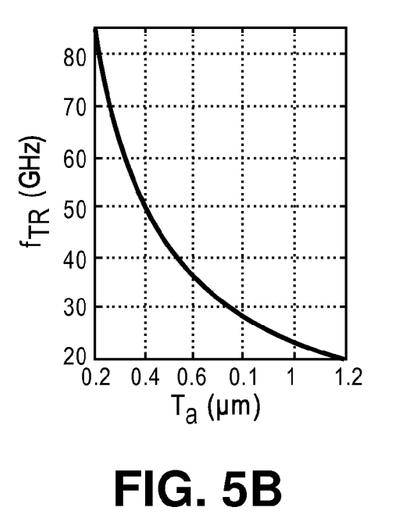

FIGS. 5A and 5B illustrate bandwidth curves as a function of three terminal photodetector device parameters, in accordance with an embodiment. FIG. 5A depicts an RC-limited bandwidth ($f_{RC}$) curve modeled as a function of the lateral width $W_d$ of both the n-type regions 206 and p-type regions 208 (with respective impurity doping levels being 9 e19 cm$^{-3}$, a 100 nm $W_i$, and a device area of 10 µm$^2$). FIG. 5B depicts a transit time-limited bandwidth ($f_{TR}$) curve modeled as a function of the thickness of a Ge absorption region 220 (with 100 nm thick diffusion barrier 212). When total bandwidth is determined as a function of both doping width $W_d$ and absorption region thickness $T_a$, 10 Gbps, 25 Gbps, and 40 GBps operations can be reached with embodiments of the photodetector described herein.

What is claimed is:

1. A monolithic three terminal photodetector, comprising:
    first doped semiconductor regions of a first conductivity type coupled to a first terminal of the photodetector;
    second doped semiconductor regions of a second conductivity type, complementary to the first type, interdigitated with the first regions over an area of a substrate with an intervening semiconductor region of lower impurity concentration than the first and second regions separating the first and second regions, the second semiconductor regions coupled to a second terminal of the photodetector; and
    a semiconductor absorption region disposed proximate to the intervening semiconductor region and coupled to a third terminal of the photodetector, and to at least one of the first and second terminals.

2. The photodetector of claim 1, wherein the first doped semiconductor regions are n-type and the second doped semiconductor regions are p-type.

3. The photodetector of claim 1, wherein the intervening semiconductor region comprises a first group IV semiconductor and wherein the absorption region comprises a second group IV semiconductor.

4. The photodetector of claim 3, wherein the first group IV semiconductor is one of Si, Ge, or a $Si_xGe_y$ alloy and wherein the second group IV semiconductor is another of Si, Ge, or $Si_xGe_y$ alloy.

5. The photodetector of claim 4, wherein the first group IV semiconductor is Si and the second group IV semiconductor is Ge and wherein the absorption region is coupled to the third terminal through a p-type region.

6. The photodetector of claim 5, wherein the absorption region has a thickness of between 0.4 µm and 3 µm.

7. The photodetector of claim 2, wherein the multiplication region and absorption regions are intrinsically doped.

8. The photodetector of claim 2, wherein the multiplication region has a width of between 30 nm and 150 nm.

9. The photodetector of claim 2, further comprising a dopant diffusion barrier between the absorption region and the multiplication region.

10. The photodetector of claim 1, wherein the area of the substrate is between 4 µm$^2$ and 20 µm$^2$.

11. A photodetector circuit, comprising:
    the photodetector of claim 1; and
    one or more voltage supply coupled to the photodetector with the second and third terminals both coupled to a common node at a reference voltage.

12. The circuit of claim 11, wherein the one or more voltage supply provides less than 6V.

13. The circuit of claim 12, wherein a reverse bias across the first and second terminal is sufficient to induce carrier multiplication within an i-layer disposed between the first and second doped semiconductor regions, and wherein a reverse bias across the first and third terminal is sufficient to induce carrier drift within the semiconductor absorption region.

14. The circuit of claim 11, wherein the semiconductor absorption region is optically coupled a waveguide.

15. The circuit of claim 11, further comprising a p-type layer coupling the semiconductor absorption region to the third terminal.

16. A monolithic three terminal photodetector, comprising:
    n-type semiconductor regions coupled to a first terminal;
    p-type semiconductor regions interdigitated with the n-type regions over an area of a substrate, the p-type semiconductor regions coupled to a second terminal;
    a semiconductor absorption region disposed proximate to the n-type and p-type regions and coupled to a third terminal and to at least one of the first and second terminals; and
    an avalanche multiplication region between the first and second terminals, wherein the multiplication region and absorption regions are intrinsically doped.

17. A monolithic three terminal photodetector, comprising:
    n-type semiconductor regions coupled to a first terminal;
    p-type semiconductor regions interdigitated with the n-type regions over an area of a substrate, the p-type semiconductor regions coupled to a second terminal;
    a semiconductor absorption region disposed proximate to the n-type and p-type regions and coupled to a third terminal and to at least one of the first and second terminals;
    an avalanche multiplication region between the first and second terminals; and
    a dopant diffusion barrier between the absorption region and the multiplication region.

18. A photodetector circuit, comprising:
    a monolithic three terminal photodetector, comprising:
        n-type semiconductor regions coupled to a first terminal;
        p-type semiconductor regions interdigitated with the n-type regions over an area of a substrate, the p-type semiconductor regions coupled to a second terminal;
        a semiconductor absorption region disposed proximate to the n-type and p-type regions and coupled to a third terminal and to at least one of the first and second terminals; and
        an avalanche multiplication region between the first and second terminals; and
    one or more voltage supply coupled to the photodetector with the second and third terminals both coupled to a common node at a reference voltage.

19. The circuit of claim 18, wherein the one or more voltage supply is to provide less than 6V.

* * * * *

UNITED STATES PATENT AND TRADEMARK OFFICE
CERTIFICATE OF CORRECTION

| | | |
|---|---|---|
| PATENT NO. | : 8,461,624 B2 | Page 1 of 1 |
| APPLICATION NO. | : 12/952023 | |
| DATED | : June 11, 2013 | |
| INVENTOR(S) | : Na et al. | |

It is certified that error appears in the above-identified patent and that said Letters Patent is hereby corrected as shown below:

In the Specification

Please insert in column 1, line 4 before FIELD:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*